United States Patent [19]

Decoursey et al.

[11] 4,196,421
[45] Apr. 1, 1980

[54] PCM ENCODER WITH VARIABLE SET-UP INTERVALS

[75] Inventors: Calvin H. Decoursey; Todd V. Townsend, both of Reno, Nev.

[73] Assignee: Lynch Communication Systems, Inc., Reno, Nev.

[21] Appl. No.: 866,337

[22] Filed: Jan. 3, 1978

[51] Int. Cl.² ............................................. H03K 13/03
[52] U.S. Cl. ............................................. 340/347 AD
[58] Field of Search .................... 340/347 AD, 347 M; 325/38 R; 179/15 A

[56] References Cited

U.S. PATENT DOCUMENTS

| | | | |
|---|---|---|---|
| 3,182,303 | 5/1965 | Howe | 340/347 AD |
| 3,438,024 | 4/1969 | Smith | 340/347 AD |
| 3,509,560 | 4/1970 | Bowers | 340/347 AD |
| 3,678,501 | 7/1972 | Prill | 340/347 AD |
| 3,781,871 | 12/1973 | Mattern | 340/347 AD |
| 4,113,997 | 9/1978 | Horna | 340/347 AD X |

*Primary Examiner*—Charles D. Miller
*Attorney, Agent, or Firm*—Phillips, Moore, Weissnberger, Lempio & Majestic

[57] ABSTRACT

Conventional PCM encoders are made capable of handling a much larger number of telephone channels than normally possible by varying the set-up interval of the encoder in accordance with the maximum signal level to be set up.

2 Claims, 5 Drawing Figures

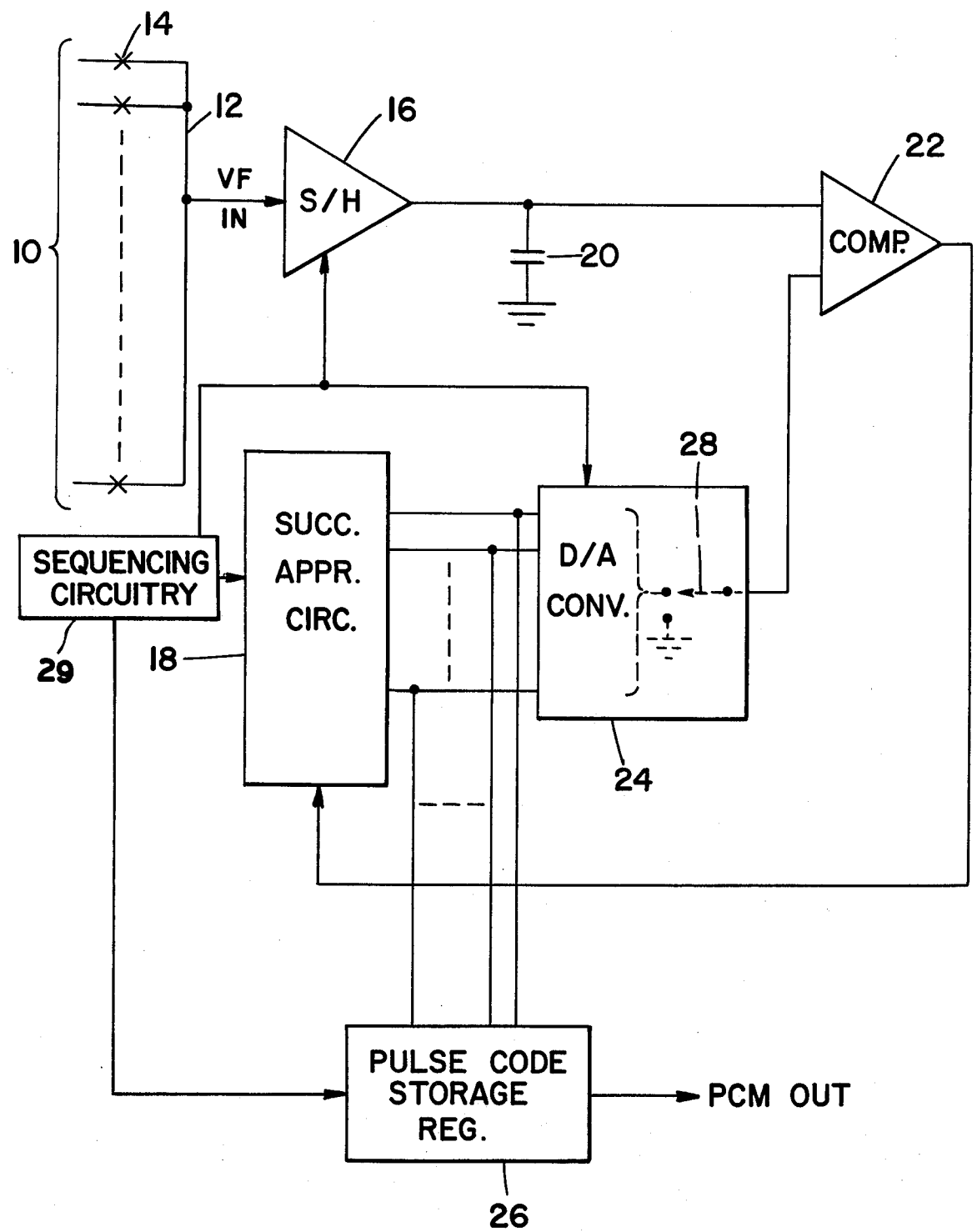
FIG_1

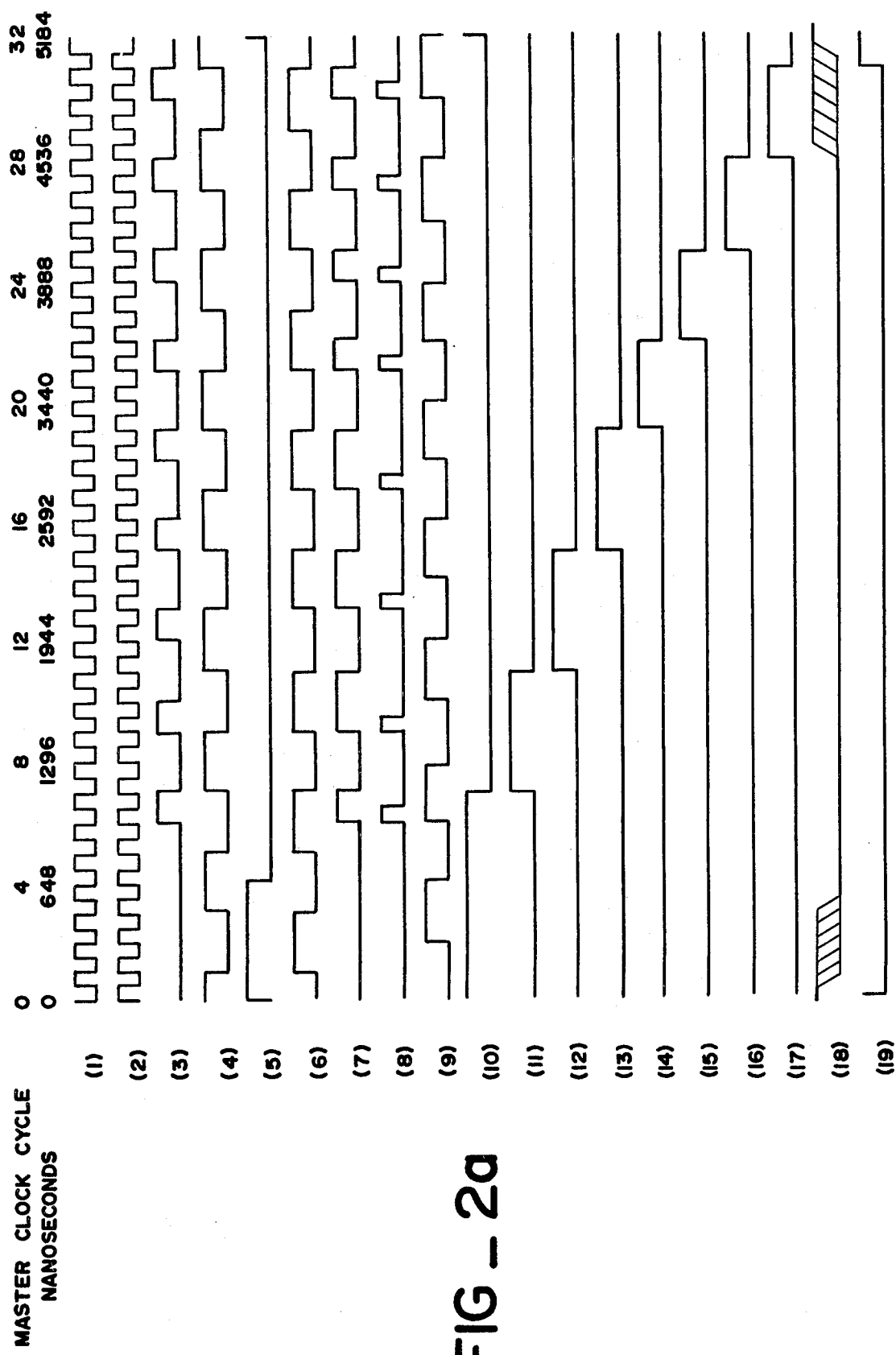
FIG.—2a

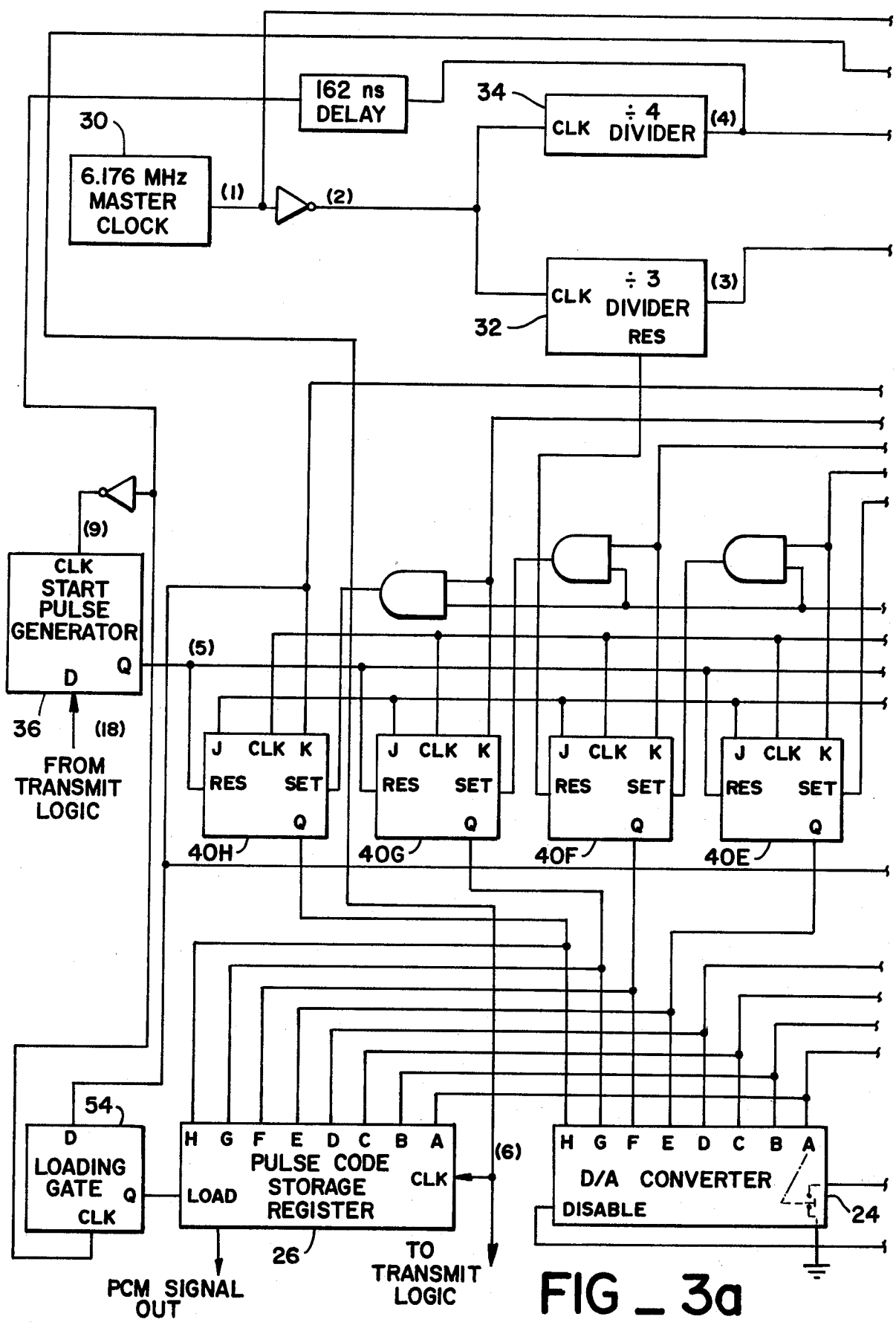
FIG _ 3a

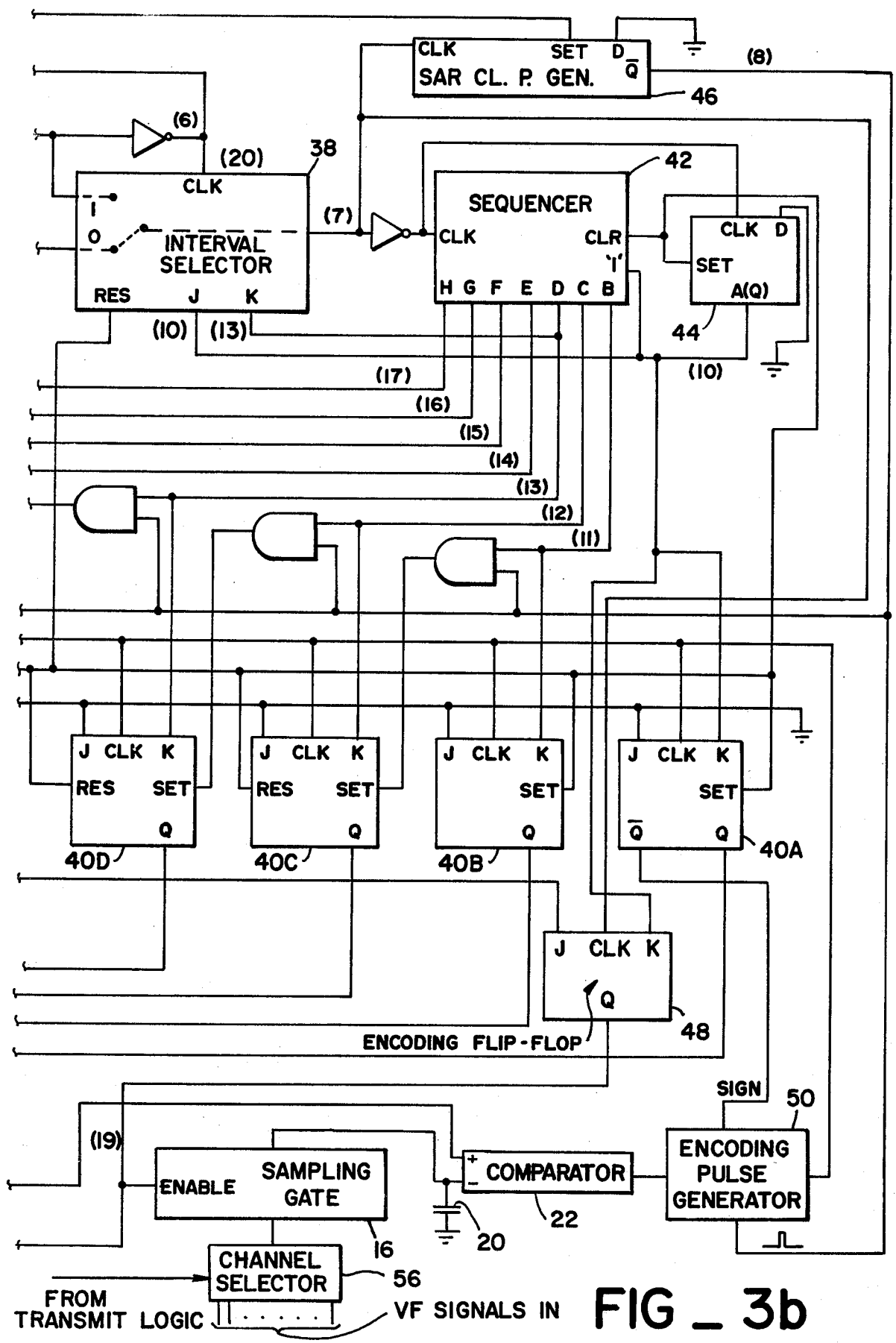
FIG _ 3b

PCM ENCODER WITH VARIABLE SET-UP INTERVALS

BACKGROUND OF THE INVENTION

Encoders for translating analog voice signals into a pulse code suitable for long distance transmission are in common use in the telephone industry. They normally involve the successive comparison of a voice signal sample with a series of reference signal levels produced by a digital-to-analog converter in response to successive digital commands from a sequencing control device.

Inasmuch as the digital-to-analog converter establishes the reference signal voltages through the use of resistive elements, and inasmuch as a certain amount of capacitance is inherent in any physical circuit, a finite amount of time is required to set up the converter for each reference signal. This time is generally proportional to the maximum level change of the reference signal to be produced.

It has heretofore been customary in the industry to provide a constant set-up time for the digital-to-analog converter at all signal levels, this time being made adequate to set up the highest required change in signal level. Unfortunately, the time constraints imposed upon the encoder in 24-channel Tl-type systems have so far made it economically impractical to encode all 24 channels with a single conventional encoder in the time available for doing so. In order to use inexpensive, relatively slow digital-to-analog converters in PCM encoders, it has generally been considered necessary to provide one encoder for every 12 channels, or two per channel bank, together with switching and timing circuitry to read out the encoded information alternately from the two encoders.

SUMMARY OF THE INVENTION

In accordance with the invention, a single encoder can be used to encode all 24 channels of a Tl-type telephone channel bank in synchronism with the transmission of the encoded signals by varying the set-up time of the digital-to-analog converter according to which bit of the PCM word is being determined for encoding.

Although it would be possible in this manner to minimize the total set-up time to its ultimate limit by providing different set-up intervals for each bit of the PCM word, it is sufficient in practice to provide only three kinds of set-up intervals: a long one for initialization plus determination of the sign bit, a short one for the most significant bit, an intermediate one for the next three most significiant bits, and a short one again for the three least significant bits.

It is therefore the object of the invention to allow the use of a single encoder for a full 24-channel Tl-type channel bank by varying the set-up intervals for the encoder's digital-to-analog converter in accordance with the bit being encoded, which defines the maximum reference signal change the converter is called upon to produce.

It is another object of the invention to achieve the above-described goal by providing three separate set-up intervals for the converter as described above.

BRIEF DESCRIPTION OF THE DRAWINGS

FIG. 1 is a block diagram illustrating the operation of the conventional PCM encoder to which this invention relates;

FIG. 3 (comprised of 3a and 3b) is a diagram, partly in block form, illustrating a circuit adapted to carry out the teachings of the invention.

DETAILED DESCRIPTION OF THE PREFERRED EMBODIMENT

Figure 2B:
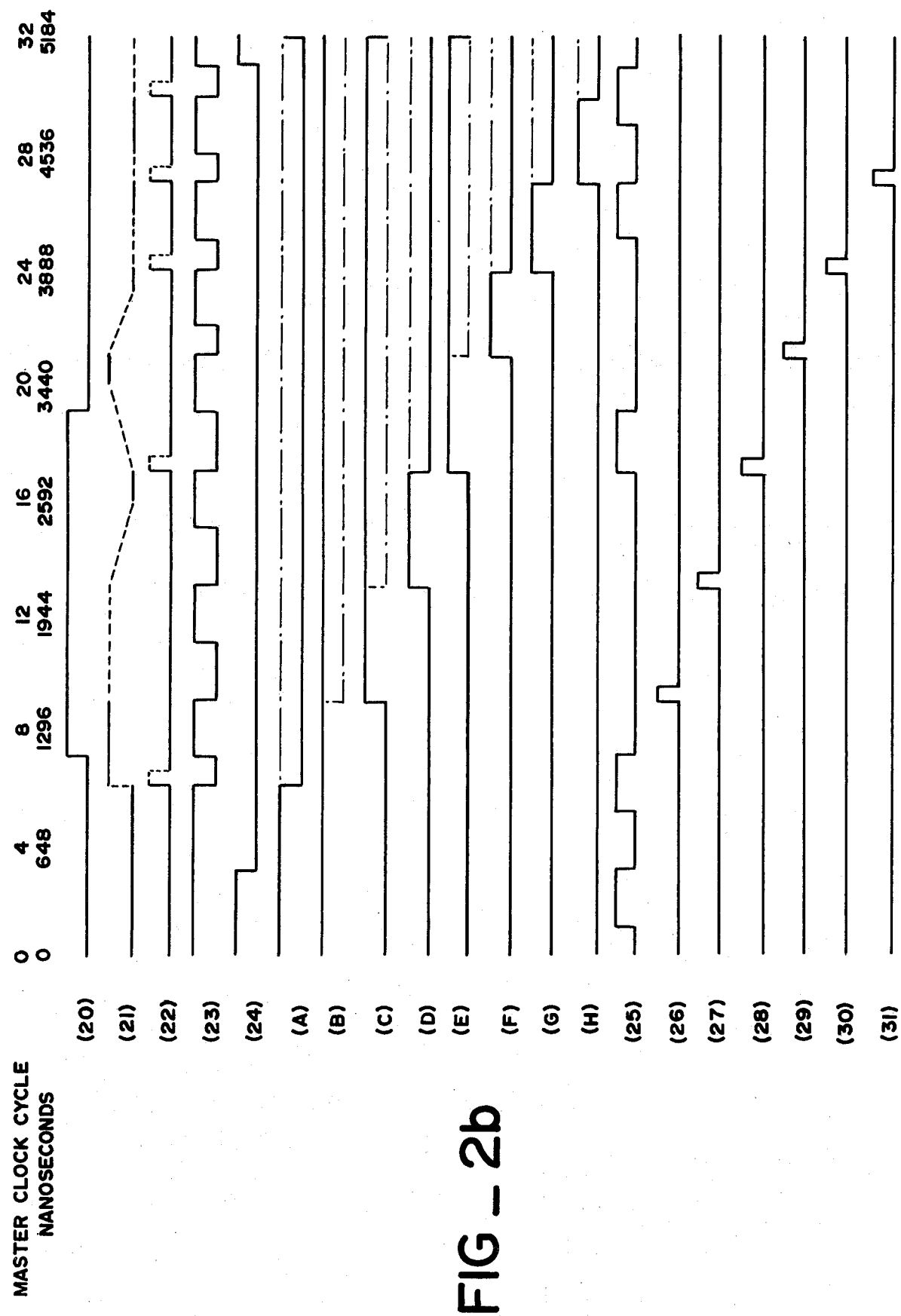
FIG. 2 (comprised of 2a and 2b) is a time-amplitude diagram illustrating the operation of the encoder of FIG. 1 in accordance with the invention.

In the telephone industry, the encoding of voice signals from a subscriber line into PCM signals suitable for transmission over multiplexed lines is conventionally done by a successive approximation technique. FIG. 1 illustrates a typical apparatus used for this purpose. In FIG. 1, the subscriber lines 10 are sampled in sequence once every 125 $\mu$s by being momentarily connected to the bus 12 through appropriate sampling gates 14.

The bus 12 provides the input to a sample-and-hold circuit 16 which, under the control of the sequencing circuitry 29, samples the signal on bus 12 and holds the sample on a holding capacitor 20. The signal sample stored on capacitor 20 provides one input to a high-impedance comparator 22. The other input to comparator 22 is the reference signal produced by digital-to-analog (D/A) converter 24 (It should be understood that the output of D/A converter may be a current rather than a voltage, in which case a current-to-voltage conversion step must be interposed). The output of comparator 22 is either logic "0" or logic "1," depending on which input is higher. This logic signal is fed back to the successive approximation register 18 and determines the setting of the PCM bit under consideration at that time in the parallel readout circuit 26.

At the beginning of each encoding period, an interval of approximately 1296 ns is provided by the sequencing circuitry 29 (which encompasses elements 42, 44 and 48 of FIG. 3) for actuating the sample-and-hold circuit 16 to read the next sample onto it (curve (24) of FIG. 2a). During this interval, the pulse code currently appearing on the sequencer output lines 26, which represents the next preceding sample, is dumped into the pulse code storage register in the conventional manner for subsequent transmission over the multiplexed telephone line.

Following the first 324 ns of the aforesaid 1296 ns interval, a 972 ns interval is provided for the resetting or initializing of all the parallel readout lines. (None of the intervals referred to herein last an exact number of nanoseconds; however, they have been rounded in this description for ease of explanation). During this interval, the sign bit (A in FIG. 2b) and the most significant amplitude bit (B in FIG. 2b) are initialized to logic "1," while all other bits (C through H in FIG. 2b) are initialized to logic "0." The reason for initializing the sign bit and most significant bit to logic "1" is to take advantage of the long initialization interval for setting up the internal circuitry of D/A converter 24 so that it will be ready for the sign bit and most significant bit determinations immediately following the 972 ns interval. At the same time, the D/A converter output is disconnected from the comparator, and the lower input (in FIG. 1) of comparator 22 is grounded by a grounding switch 28 (if the D/A converter has a current output instead of a voltage output, the switch 28 instead opens the current path as indicated in FIG. 3a). The switch 28 is normally an integral part of the D/A converter chip 24.

The initialization of all bits consumes 648 ns of the 972 ns interval. During the entire 972 ns interval, the comparator compares the voice signal sample to ground level and thus determines the sign of the voice signal sample. On the basis of this determination, the successive approximation circuitry 18 sets the sign bit line A to logic "0" or logic "1" at the end of the 972 ns interval. At the same time, it operates the grounding switch 28 to reconnect the lower input of comparator 22 to the analog output of D/A converter 24. The latter has had ample time to set up to the highest-significant-bit level during the 972 ns interval; consequently, a short (486 ns) interval is sufficient to stabilize the analog reference signal being applied to comparator 22 by the D/A converter 24, and to perform the comparison which enables the successive approximation circuitry 18 to make the appropriate logic decision for the setting of most-significant-bit line B.

Concurrently, with the setting of most-significant-bit line B, the successive approximation circuitry 18 raises the next-most-significant-bit line C to logic "1." This causes D/A converter 24 to increase or decrease its output level (depending on the status of lines A and B) by one-fourth of the maximum voice signal level. The magnitude of this increment or decrement is such that it cannot be reliably completed within 486 ns. Consequently, the circuit of this invention provides a 648 ns interval for setting up this reference signal level, and for making the comparison required for the proper setting of line C by the successive approximation circuitry 18.

The process of successive approximation continues in the same manner through the least significant bit H, each line being raised to logic "1" in turn when the preceding line is set in accordance with the result of the preceding comparison.

It will be seen from FIG. 2b that 648 ns intervals are provided for bits C, D and E, while 486 ns intervals are provided for bits F, G and H. The set-up of the latter three bits involves a maximum potential change at the output of D/A converter 24 much smaller than that of the more significant bits; consequently, they can be set up much more rapidly than bits C, D or E.

The alternative use of either a 486 ns interval or a 648 ns interval, as required, saves sufficient time to allow the encoder of this invention to sample each channel in less than 5.2 μs, and thus to sample all 24 channels of a T1-type channel bank within the 125 μs frame period of the standard PCM telephone system.

The circuit for carrying out the above-described inventive technique is shown generally in block form in FIG. 3. The parenthetical numbers appearing on FIG. 3 refer to the correspondingly numbered curves in FIG. 2a and indicate the logic signals appearing at various points in the circuit of FIG. 3. Although, in practice, various kinds of logic chips with other characteristics may be used, the following discussion of FIG. 3 assumes that all logic elements shown have non-inverting inputs, and that all elements are clocked by the rising edge of the clock signal applied to them.

The inventive circuit of FIG. 3 is driven by a 6.176 MHz master clock 30, whose output is shown in curve (1) of FIG. 2a. The master clock output is inverted (curve (2) of FIG. 2a) and used to clock a pair of dividers 32, 34. The dividers 32, 34 are pairs of J-K flip-flops cross-connected in a well-known manner so that the output of divider 32 is high for one cycle of the inverted master clock and low for two (curve (3) of FIG. 2a), while the output of divider 34 is high for two cycles and low for two (curve (4) of FIG. 2a). The output phase of these circuits is so selected that following the end of a reset operation, the output of divider 32 rises on the second rising edge of the clock and on every third rising edge thereafter. The output of divider 34 rises on the fourth rising edge of the clock and on every fourth rising edge thereafter.

The apparatus of this invention is initialized (i.e. set or reset as necessary) by a start pulse (curve (5), FIG. 2a) produced by start pulse generator 36. This device is a D-type flip-flop whose D input is enabled by an appropriate "go" signal (curve (18), FIG. 2a) from the transmit logic (not shown) of the PCM transmitter equipment, of which the invention forms a part, whenever the transmit logic is ready for the encoding of a voice-frequency (VF) signal sample. The next rising edge of the output of divider 34, delayed by one master clock cycle and inverted, (curve (9), FIG. 2a) drives the Q output of start pulse generator 36 high for one cycle of divider 34, i.e. 648 ns.

The start pulse resets divider 32, interval selector 38, and selective approximation registers (SAR's) 40C through 40H, which together make up the successive approximation circuitry 18 of FIG. 1. It clears sequencer 42 to an all "0" status, and it sets the sequence initiating flip-flop 44 as well as SAR's 40A and 40B.

During the start pulse and immediately thereafter, the status of the SAR's, reading from the sign bit A to the least significant bit H, is 11000000 (see FIG. 2b). While A is high, the output of D/A converter 24 is conventionally internally grounded (or, in the case of a current output, opened) to correspond to a zero or ground-level sample. At the same time, the reference signal for the first significant bit B is being set up within the D/A converter 24 by the logic "1" on its B input.

The interval selector 38 is functionally a J-K type flip-flop circuit which, on the rising edge of the CLK input, connects the 1 input to the output if J is high and K is low. If the reverse is true, or if RES is high, the rising edge of CLK connects the 0 input to the output; and CLK leaves the status of interval selector 38. The "switch position" of interval selector 38 is shown as curve (20) in FIG. 2a.

Two master clock cycles after the end of the start pulse, the output of divider 32 (curve (3), FIG. 2a) goes high. No rising edge of CLK (curve (6), FIG. 2a) has as yet occurred at interval selector 38, so the interval selector 38 remains in the reset (0) position, and the rising edge of the divider 32 output is transmitted to SAR clocking pulse generator 46. SAR clocking pulse generator 46 is a D type flip-flop whose D input is grounded. The master clock (curve (1), FIG. 2a) is applied to its SET input, so that its $\overline{Q}$ output is normally low. When a rising edge is applied to its CLK input while the master clock is low, the $\overline{Q}$ output momentarily goes high until it is driven low again when the master clock next goes high. Inasmuch as (because of the inverted master clock input to dividers 32, 34 and the propagation delays through dividers 32, 34 and interval selector 38) a change of state of the output of interval selector 38 (curve (8), FIG. 2a) is a short pulse of somewhat less than 80 ns duration immediately following each rising edge of the output of interval selector 38.

The rising edge of the interval selector output (curve (7), FIG. 2a) is also applied to the CLK input of encoding flip-flop 48 whose J input (curve (17), FIG. 2a) is low and whose K input (curve (10), FIG. 2a) is high at that moment. This causes the Q output of flip-flop 48 (curve (19), FIG. 2a) to go low so as to disable the sampling gate 16 and enable the D/A converter 24.

Assuming that the sample on holding capacitor 20 is negative, the comparator 22 puts out a logic "1" (The description of the circuitry herein contemplates the encoding of a negative voice signal sample having an amplitude encodable as "1101000"). The encoding pulse generator 50 compares the logic levels of the comparator output (curve (21) in FIG. 2a) and the sign bit from the $\overline{Q}$ output of flip-flop 40A. If they match (as they do in the stated example), the sign bit sent by the start pulse is incorrect (note the polarity of the inputs to comparator 22), and the correcting pulse generator 50 transmits the SAR clocking pulse from SAR clocking pulse generator 46 to the CLK inputs of all the successive-approximation-register flip-flops 40A through 40H (curve (8) in FIG. 2a).

Inasmuch as, at this time, only flip-flop 40A has its K input at logic "1," the SAR clocking pulse, if transmitted through correcting pulse generator 50, can and does flip only flip-flop 40A, thereby changing the sign bit supplied to inputs A of the D/A converter 24 and the pulse code storage register 26. If the comparator output and the sign bit had not matched (i.e. if the sign bit as set by the start pulse had been correct), no correcting pulse would have been transmitted by correcting pulse generator 50.

At the next rising edge of the CLK input of sequencer 42 (curve (23) in FIG. 2a), B output of the sequencer 42 goes high while the grounded D input of flip-flop 44 causes its Q output to go low. The comparing and correcting sequence now repeats itself for the first significant bit B in the same manner as described above for the sign bit. At each succeeding rising edge of the CLK input of sequencer 42, the next succeeding output of sequencer 42 goes high while the previously high output goes low again.

When any one of the first six outputs of sequencer 42 goes high, it enables the correspondingly lettered set-up gate 52. When the next SAR clocking pulse occur at the output of SAR clocking pulse generator 46, the next following successive-approximation-register flip-flop 40 is set so as to set up the next reference level in D/A converter 24.

When the "1" level in the output of sequencer 42 has finally progressed all the way to output H, the D input of loading gate 54 goes high in preparation for the loading of the encoded sample into the pulse code storage register 26. Immediately upon the end of the correcting pulse (if any) which encodes the correct logic level onto the H input of pulse code storage register 26, the CLK input of loading gate 54 rises and causes loading gate 54 to energize the LOAD input of pulse code storage register 26. This causes the various logic levels supplied to inputs A through H of storage register 26 by the successive-approximation-register flip-flops 40A through 40H, respectively, to be parallel-loaded into storage register 26. The storage register 26 is then serially read out by successive rising edges at the CLK input of storage register 26 (curve (6), FIG. 2a) while the next sample is being encoded as described above.

The "1" on output H of sequencer 42 enables the J input of encoding flip-flop 48. The next rising edge at its CLK input (curve (7), FIG. 2a) triggers encoding flip-flop 48 to cause the sampling gate 16 to load the next voice frequency signal sample (selected by the transmit logic from channel selector 56) onto holding capacitor 20. The above-described encoding process then repeats itself.

It will be seen that the circuit of this invention effectively condenses the encoding process into the approximately 5184 ns interval (actually closer to 5181 ns in reality because the master clock cycle is not quite exactly 162 ns long as assumed in this description) corresponding to the time allocated for the transmission of one voice-frequency sample over a Tl-type PCM telephone system. As will be noted from curves B through H of FIG. 2a, the set-up time available for the most significant bit B (i.e. the time during which B is always high) is approximately 1458 ns (from cycle 0 to cycle 9 in FIG. 2a); the set-up time available for bits C, D and E is approximately 648 ns; and the set-up time available for bits F, G and H is approximately 486 ns.

The ability of the inventive device to encode all 24 channels of a Tl-type channel bank with a single encoder which can be read synchronously with the encoding process results in substantial savings and improved reliability not only because of the elimination of the second encoder, but also because of the elimination of the complex circuitry necessary for the alternate operation of two encoders.

What is claimed is:

1. Successive approximation apparatus for encoding an analog voice-frequency sample into an eight-bit pulse code format suitable for transmission over a PCM telephone system having a fixed master clock cycle, characterized thereby:

that prior to the encoding of each voice-frequency sample, the sign bit and the most significant bit are preset to logic "1" while all other bits are preset to logic "0"; and that at least three different set-up interval lengths are provided for the setting up of the various reference signals used in the successive approximations, the interval length used for the setting up of any given reference signal being always an integral multiple of said master clock cycle, and being a relatively long set-up interval for setting up the reference signal used in determination of the sign bit, an equal set-up interval plus a short set-up interval for setting up the reference signal used in determination of the most significant bit, an intermediate length interval for setting up each of the reference signals from the next three most significant bits, and a short interval for setting up each of the reference signals for the last three significant bits.

2. The encoder of claim 1, in which said PCM telephone line is a 24-channel Tl-type line, and in which the lengths of said set-up intervals are such that their sum is substantially equal to 1/24 of the analog signal sampling interval in the Tl system.

* * * * *